(12) United States Patent
Li et al.

(10) Patent No.: US 8,698,560 B2
(45) Date of Patent: Apr. 15, 2014

(54) VARIABLE-GAIN LOW NOISE AMPLIFIER

(75) Inventors: Qiang Li, Irvine, CA (US); Si-Ning Zhou, Irvine, CA (US)

(73) Assignee: MStar Semiconductor, Inc., Hsinchu County (TW)

( * ) Notice: Subject to any disclaimer, the term of this patent is extended or adjusted under 35 U.S.C. 154(b) by 42 days.

(21) Appl. No.: 13/467,149

(22) Filed: May 9, 2012

(65) Prior Publication Data

US 2013/0300502 A1 Nov. 14, 2013

(51) Int. Cl.
*H03F 3/45* (2006.01)
*H03G 1/00* (2006.01)

(52) U.S. Cl.
CPC .................................. *H03G 1/0023* (2013.01)
USPC .......................................... 330/254; 327/359

(58) Field of Classification Search
USPC .......................................... 330/254; 327/359
See application file for complete search history.

(56) References Cited

U.S. PATENT DOCUMENTS

2007/0132511 A1* 6/2007 Ryynanen et al. ............ 330/254

* cited by examiner

*Primary Examiner* — Robert Pascal
*Assistant Examiner* — Khiem Nguyen
(74) *Attorney, Agent, or Firm* — WPAT, PC; Justin King

(57) ABSTRACT

The present disclosure relates to variable-gain low noise amplifiers and RF receivers. An exemplary method for processing a RF signal provides a low noise amplifier with main and auxiliary amplifier modules. When a selection indicates the low noise amplifier operating in a high-gain mode, the main and auxiliary amplifier modules are coupled in parallel. When the selection indicates the low noise amplifier operating in a low-gain mode, the main and auxiliary amplifier modules are cross coupled. When a selection indicates the low noise amplifier operating in a moderate-gain mode, the auxiliary amplifier modules are disconnected from the main amplifier module.

16 Claims, 5 Drawing Sheets

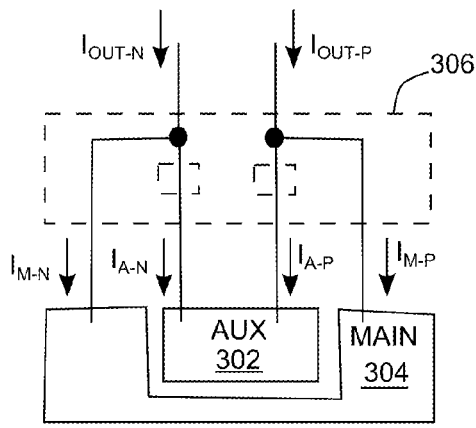
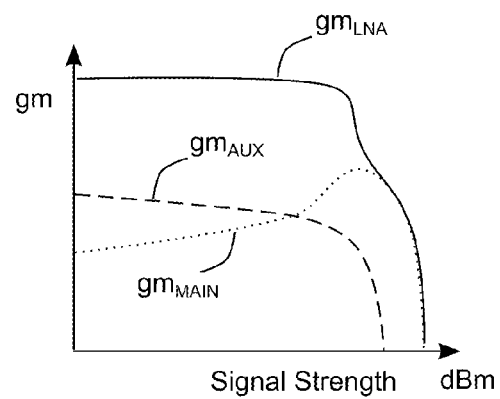
FIG. 5A  FIG. 5B
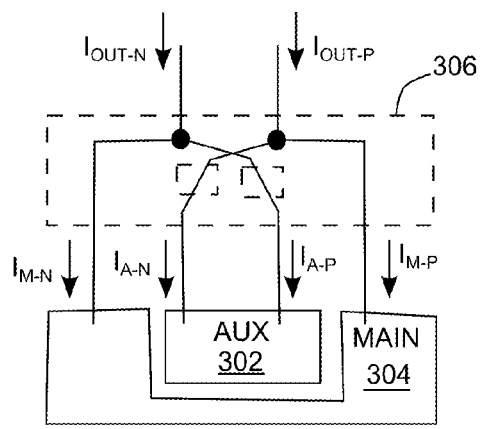
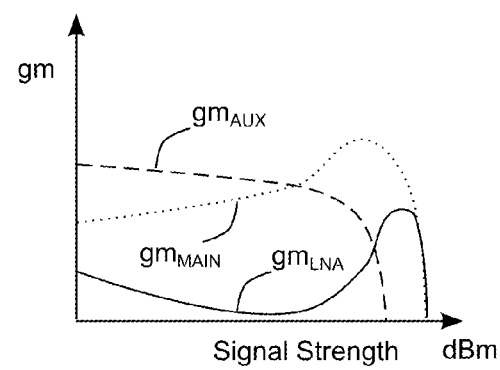
FIG. 6A  FIG. 6B

VARIABLE-GAIN LOW NOISE AMPLIFIER

FIELD OF THE INVENTION

The present disclosure relates generally to the design and implementation of radio frequency (RF) receivers, and more specifically, to the design and implementation of low-noise amplifiers (LNAs).

BACKGROUND OF THE INVENTION

A dynamic range of a receiver, a ratio between the largest signal and the smallest signal which can be detected by the receiver, is a critical performance parameter of receivers. The receiver linearity is determined by the largest signal applied to the receiver; for any signal larger than the largest signal, one or more stages in the receiver chain enter a saturation region and thus introduce distortion. The receiver sensitivity is determined by the smallest signal applied to the receiver, which in turn is determined by a receiver noise figure. Large dynamic ranges are often required, allowing the receiver to operate over a variety of input signal conditions. Therefore, high receiver linearity is required together with a low noise figure.

Being the first active circuit after an antenna, a LNA is a crucial block for a receiver or transceiver. To improve receiver sensitivity or reduce the receiver noise figure, a LNA with a high power gain, which deemphasizes the noise distributions further downstream in the receiver, is required. However, a LNA with high power gain amplification is not only a target of in-band signals but also any out-of-band interference near the tone frequency of the target signal. If the target signal or the out-of-band interferers are strong, the LNA may render the LNA itself or following mixers saturated, inadvertently deteriorating the linearity of the receiver. It can be seen from the above analysis that, a LNA prefers a high power gain in consideration of receiver noise figure, but in contrast, favors low power gain in consideration of receiver linearity. A compromised design is to have a LNA with a moderate power gain to balance the linearity and the noise figure. A better solution, though, is to have a LNA whose power gain can be switched or varied depending on the strength of the in-band signal or the out-of-band interferers.

FIG. 1 demonstrates a variable-gain LNA according to the prior art. LNA 100 is a differential amplifier with a common-source amplifier configuration. A control voltage $V_{CTRL}$ controls transistors MSL and MSR to steer currents that MOS transistors MAL and MAR conduct away from output nodes $OUT_N$ and $OUT_P$. The higher the control voltage $V_{CTRL}$ is, the more current passes through the transistors MSL and MSR, and the lower the transconductance of LNA 100 is. Accordingly, the power gain of the LNA 100 is variable, and can be controlled via the control voltage $V_{CTRL}$.

SUMMARY OF THE INVENTION

An exemplary variable-gain low noise amplifier includes a plurality of amplifier modules and a current steering module. The plurality of amplifier modules have input nodes capacitively coupled to each other for receiving a radio frequency (RF) signal, and output current. The current steering module is selectively coupled to the plurality of amplifier modules for directing the currents for output according to a plurality of control signals. A power gain of the low noise amplifier is a linear combination of power gains of the plurality of amplifier modules.

An exemplary low noise amplifier includes a main amplifier module, an auxiliary amplifier module, and a gain control module. The main and auxiliary amplifier modules have input nodes capacitively coupled for receiving a RF signal, and respectively have main and auxiliary transconductances for the inbound RF signal. The gain control module is coupled to receive output currents from main and auxiliary amplifier modules. The gain control module is configured in a way that when the low noise amplifier operates in a high-gain mode, the low noise amplifier has a first transconductance substantially equal to the main transconductance plus a first portion of the auxiliary transconductance. When the low noise amplifier operates in a moderate-gain mode, the low noise amplifier has a second transconductance substantially equal to the main transconductance.

An exemplary method of processing a RF signal first provides a low noise amplifier with a plurality of main and auxiliary amplifier modules. The main and auxiliary amplifier modules are coupled in parallel when a selection indicates the low noise amplifier operating in a high-gain mode such that the low noise amplifier has a transconductance proportional to a sum of transconductance of the amplifier modules. The main and auxiliary amplifier modules are cross coupled when the selection indicates the low noise amplifier operating in a low-gain mode, such that the low noise amplifier has a transconductance proportional to a subtraction of the transconductance of the amplifier modules.

BRIEF DESCRIPTION OF THE DRAWINGS

The invention can be more fully understood by the subsequent detailed description and examples with references made to the accompanying drawings, wherein:

FIG. 5A shows current paths resulted in FIG. 3 when a current steering module operates in a high-gain mode;

FIG. 5B illustrates $gm_{AUX}$, $gm_{MAIN}$, and $gm_{LNA}$ resulted when a LNA operates in a high-gain mode;

FIG. 6A shows current paths resulted in FIG. 3 when a current steering module operates in a low-gain mode;

FIG. 6B illustrates $gm_{AUX}$, $gm_{MAIN}$, and $gm_{LNA}$ resulted when LNA 300 operates in a low-gain mode;

DETAILED DESCRIPTION OF PREFERRED EMBODIMENTS

The present invention will be described herein in the context of exemplary low-noise amplifiers for receivers. Although illustrative embodiments of the present invention may be particularly well-suited for a RF receiver or transceiver, illustrative embodiments of the present invention may be used in a variety of contexts, including a broad range of communications, radar, and radiometry applications.

It is therefore to be understood that the techniques of the present invention are not limited to the methods and apparatuses shown and described herein. Rather, alternative methods and apparatuses within the scope of the invention will become apparent to those skilled in the art given the teaching therein.

Figure 1:
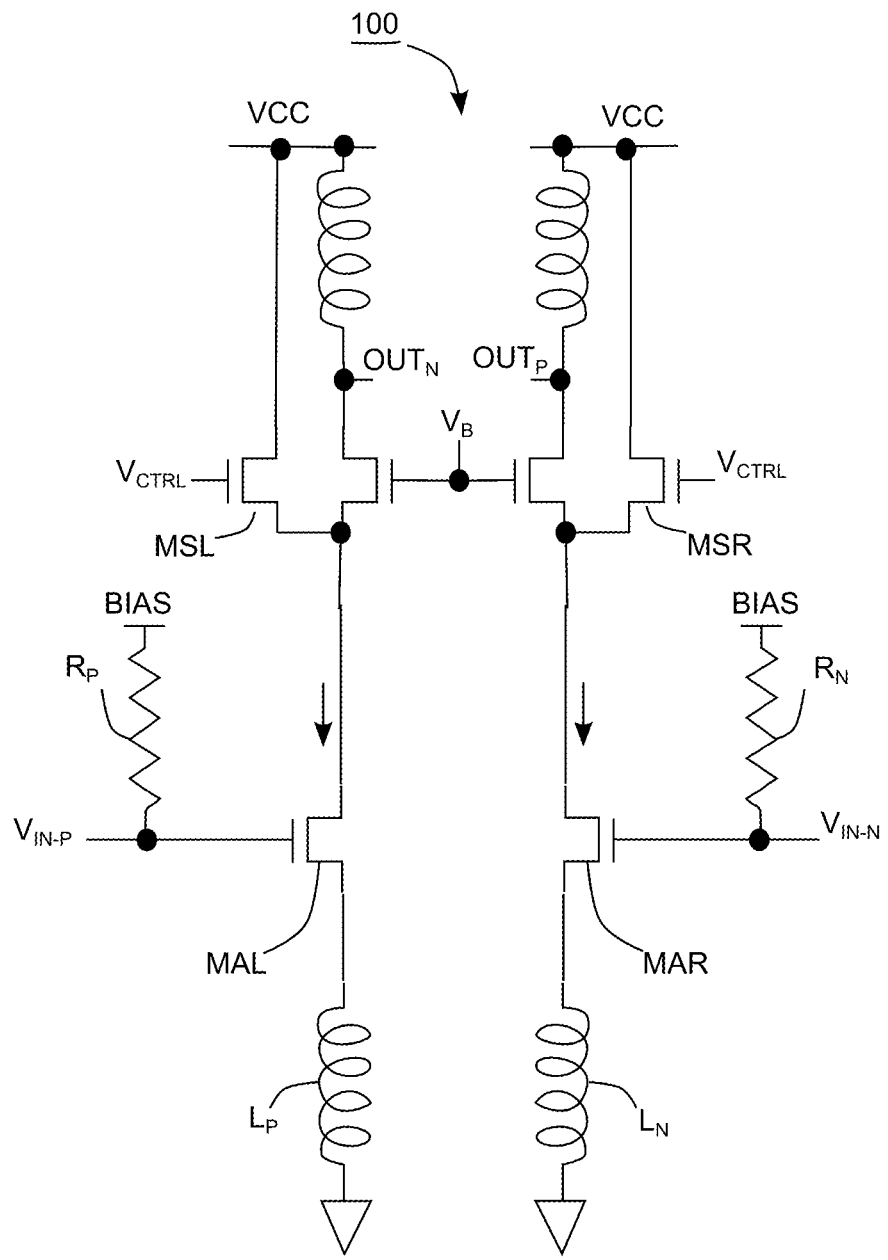
FIG. 1 demonstrates a variable-gain LNA according to the prior art.
Figure 2:
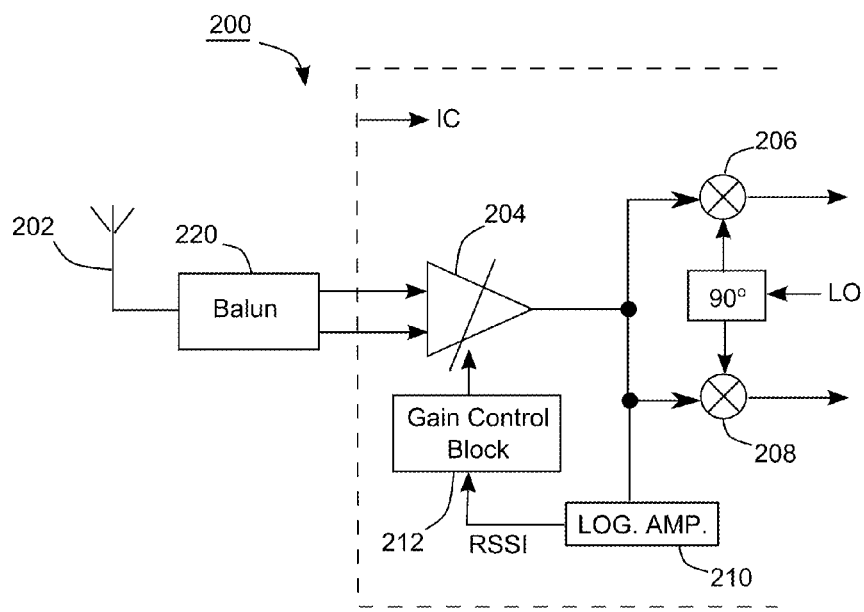
FIG. 2 is a block diagram of an exemplary homodyne wireless receiver suitable for use with an illustrative embodiment of the present invention.

FIG. 2 is a block diagram of a homodyne wireless receiver suitable for an illustrative embodiment of the present invention. A RF receiver 200 includes an antenna 202, a balun 220, a variable-gain low-noise amplifier (LNA) 204, a pair of down-conversion mixers 206 and 208, a logarithmic amplifier 210, and a gain control block 212. The balun 220 converts the unbalanced inbound RF signal from antenna 202 into two complementary inbound RF signals, which are then fed to differential inputs of the LNA 204. The down-conversion mixers 206 and 208 receive local oscillation signal LO with a 90-degree rotation there between, for down converting amplified RF signal output from LNA 204. The logarithmic amplifier 210 measures the power presented in the amplified RF signal to provide a received signal strength indicator (RSSI), based on which the gain control block 212 determines the power gain of the LNA 204. It can be seen from the above that the RF receiver 200 might be a SAW-less receiver since no surface acoustic wave (SAW) filter is included on the signal path from the antenna 202 to the LNA 204. In another embodiment, the RF receiver 200 further includes a SAW filter to provide bandpass filtering prior to the LNA 204. The LNA 204, the logarithmic amplifier 210, the gain control block 212, and the down-conversion mixers (206 and 208) may be implemented in an integrated circuit chip. Conventional aspects of the RF receiver 200 and other receivers and/or transceivers suitable for an illustrative embodiment of the present invention are well-known to those skilled in the art.

Figure 3:
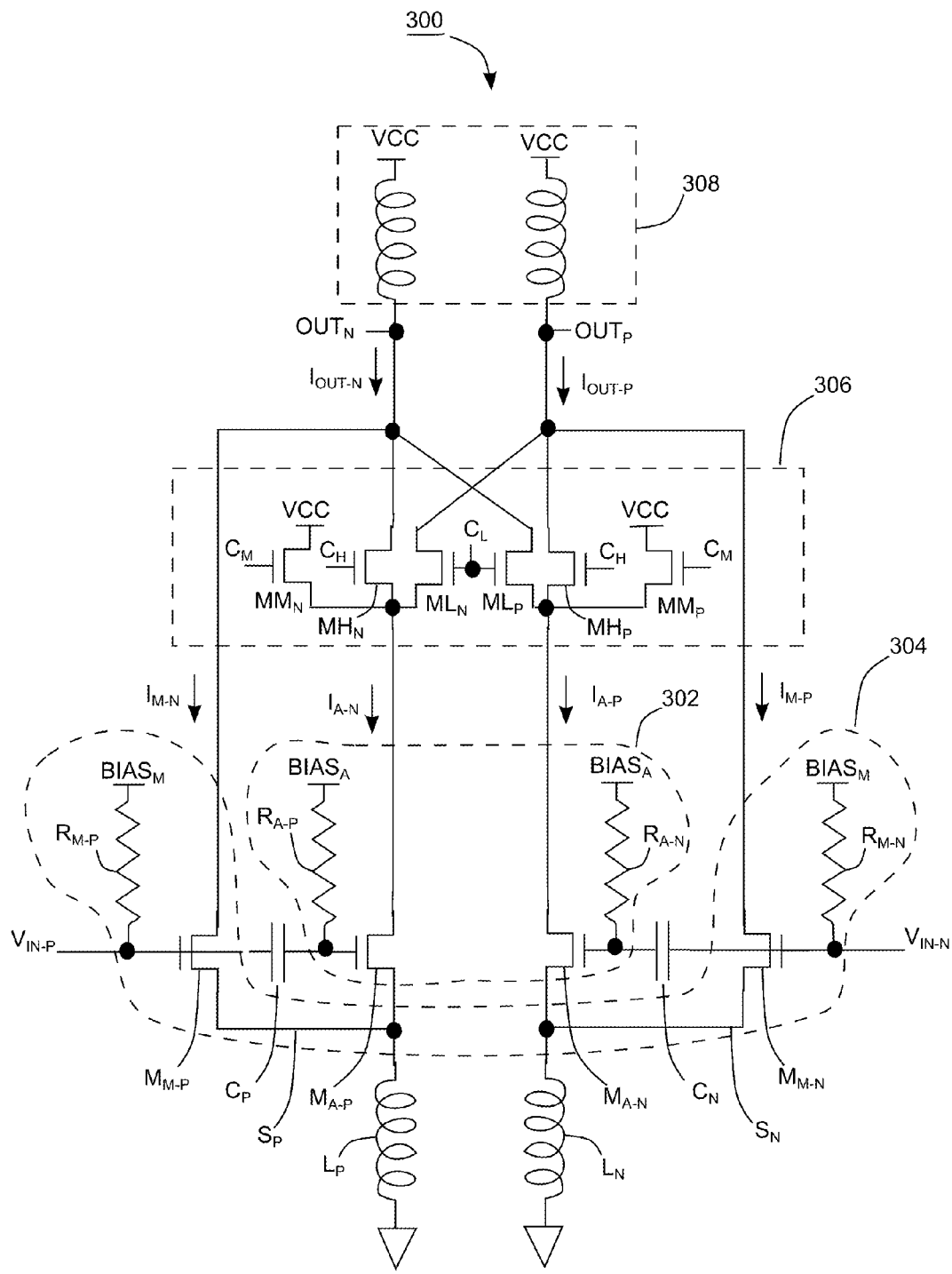
FIG. 3 shows a block diagram of exemplary LNA 300, capable of implementing the LNA in FIG. 2 according to an illustrative embodiment of the invention.

FIG. 3 shows a block diagram of a LNA 300 in one embodiment of the present invention, capable of implementing the LNA 204 of FIG. 2 according to an illustrative embodiment of the invention. The LNA 300 has a main amplifier 304, an auxiliary amplifier 302, a current steering module 306, and an output load 308.

The main amplifier 304 is a differential transconductance amplifier with input nodes capacitively coupled to receive the inbound RF signal, consisting of complementary signals $V_{IN-P}$ and $V_{IN-N}$, and to generate currents $I_{M-P}$ and $I_{M-N}$ for output. The auxiliary amplifier 302, similar to the main amplifier 304, has input nodes capacitively coupled via capacitors $C_P$ and $C_N$ to receive the complementary signals $V_{IN-P}$ and $V_{IN-N}$ and to generate output currents $I_{A-P}$ and $I_{A-N}$. The main and auxiliary amplifiers 304 and 302 are of a same common-source amplifier configuration, and share inductors $L_P$ and $L_N$ to respectively couple common source nodes $S_P$ and $S_N$ to a ground voltage.

The current steering module 306, coupled among the output load 308 and the amplifiers 304 and 302, includes transistors $MH_N$, $MM_N$, $ML_N$, $MH_P$, $MM_P$, and $ML_P$, which steer output currents $I_{A-P}$ and $I_{A-N}$, and the current gain provided by the LNA 300 varies accordingly. Control signals $C_M$, $C_H$, and $C_L$, coming from a gain control block for example, controls the transistors in the current steering module 306, making the LNA 300 operate in one of several modes. The transistors $MH_N$ and $MH_P$, switched on or off by the control signals $C_H$, could selectively provide current paths to allow the amplifiers 304 and 302 to couple in parallel. The current paths switched by the transistors $ML_N$ and $ML_P$ are for enabling the amplifiers 304 and 302 to cross couple. The transistors $MM_N$ and $MM_P$ are switched on by the control signal $C_M$ to decouple the auxiliary amplifiers 302 from the main amplifier 304 where the current path terminates the auxiliary amplifier 302 to Vcc.

For simplification, transconductances of the LNA 300, the main amplifiers 304, and the auxiliary amplifier 302, measured by the ratio of the current change at output to the voltage change at input, are hereinafter referred to as $gm_{LNA}$, $gm_{MAIN}$, and $gm_{AUX}$, respectively. In one mode, for example, the main and auxiliary amplifiers 304 and 302 are coupled in parallel in a way that $gm_{LAN}$ is substantially equaled to $gm_{MAIN}$ plus at least a portion of $gm_{AUX}$. In another mode, the main and auxiliary amplifiers 304 and 302 are coupled in a way that $gm_{LAN}$ is substantially equaled to $gm_{MAIN}$ minus at least a portion of $gm_{AUX}$. Following details the operation of some modes, based on an assumption that $gm_{MAIN}$ and $gm_{AUX}$ stay substantially unchanged when the operation mode of the current steering module 306 is changed.

Figure 4A:
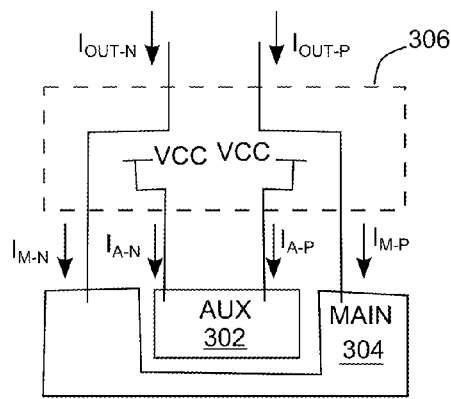
FIG. 4A shows current paths resulted in FIG. 3 when a current steering module operates in a moderate-gain mode.
Figure 4B:
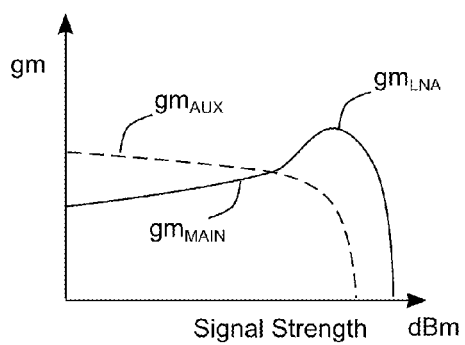
FIG. 4B illustrates $gm_{AUX}$, $gm_{MAIN}$, and $gm_{LNA}$ when a LNA operates in a moderate-gain mode.

When a receiver or transceiver with the LNA 300 operates in an environment having moderate interferers in comparison with the target inbound RF signal, the LNA 300 should operate in a moderate-gain mode. As previously stated, the control signal $C_M$ turns on the transistor $MM_N$ and $MM_P$, and the control signals $C_H$ and $C_L$ turn off the transistors $MH_N$, $ML_N$ and $MH_P$, $ML_P$. As a result, the current steering module 306 directs output currents $I_{A-N}$ to voltage source Vcc, i.e., the auxiliary amplifier 302 terminates to Vcc. FIG. 4A shows current paths resulting in FIG. 3 when the current steering module 306 operates in a moderate-gain mode. As the output currents $I_{A-N}$ and $I_{A-P}$ reaches neither the output node $OUT_N$ nor the output node $OUT_P$, the current steering module 306 decouples the auxiliary amplifier 302. The output currents $I_{OUT-N}$ and $I_{OUT-P}$ is now only determined by the output currents $I_{M-N}$ and $I_{M-P}$, and the main amplifier 304 solely contributes the transconductance of the LNA 300. As a result, $gm_{LNA}$ approximates $gm_{MAIN}$, and is independent from $gm_{AUX}$. FIG. 4B illustrates $gm_{AUX}$, $gm_{MAIN}$, and $gm_{LNA}$ when LNA 300 operates in a moderate-gain mode, showing curves of $gm_{LNA}$ and $gm_{MAIN}$ overlapping to each other as the inbound RF signal varies.

When a receiver or transceiver with LNA 300 operates in an environment having weak interferers in comparison with the target inbound RF signal, the LNA 300 should operate in a high-gain mode. To operate in high gain mode, the control signal $C_H$ turns on the transistor $MH_N$ and $MH_P$, and the control signals $C_M$ and $C_L$ turn off the transistors $MM_N$, $ML_N$, $MM_P$, and $ML_P$. The current steering module 306 directs the output current $I_{A-N}$ to the output node $OUT_N$, and the output current $I_{A-P}$ to the output node $OUT_P$. FIG. 5A shows current paths resulted in FIG. 3 when the current steering module 306 operates in a high-gain mode. Output currents $I_{A-N}$ and $I_{M-N}$ are summed up in the output node $OUT_N$ to be the output current $I_{OUT-N}$, and the output currents $I_{A-P}$ and $I_{M-P}$ are summed up in the output node $OUT_P$ to be the output current $I_{OUT-P}$. FIG. 5A also illustrates that the auxiliary amplifier 302 and the main amplifier 304 are parallel coupled, each contributing its own transconductance to boost $gm_{LNA}$. Therefore, $gm_{LNA}$ is approximately the summation of $gm_{MAIN}$ and $gm_{AUX}$. FIG. 5B illustrates $gm_{AUX}$, $gm_{MAIN}$, and $gm_{LNA}$ when LNA 300 operates in a high-gain mode. As shown in FIG. 5B, for every specified power of the inbound RF, $gm_{LNA}$ is substantially $gm_{MAIN}$ plus $gm_{AUX}$.

When a receiver or transceiver with LNA 300 operates in an environment having strong interferers in comparison with the target inbound RF signal, the LNA 300 should operate in a low-gain mode. Accordingly, the control signal $C_L$ turns on the transistor $ML_N$ and $ML_P$, and the control signals $C_M$ and $C_H$ turns off the transistors $MM_N$, $MH_N$, $MM_P$, and $MH_P$. The current steering module 306 directs the output current $I_{A-P}$ to the output node $OUT_N$, and the output current $I_{A-N}$ to the output node $OUT_P$. FIG. 6A shows current paths resulted in FIG. 3 when the current steering module 306 operates in a low-gain mode. The output currents $I_{A-P}$ and $I_{M-N}$ are summed up in the output node $OUT_N$ to be output current $I_{OUT-N}$, and the output currents $I_{A-N}$ and $I_{M-P}$ are summed up in the output node $OUT_P$ to be the output current $I_{OUT-P}$. FIG. 6A also indicates that the auxiliary amplifier 302 and the main amplifier 304 are cross coupled because the output currents $I_{A-P}$ and $I_{M-N}$ come from inverted and non-inverted sides, respectively. As the small signals residing in the output currents $I_{A-P}$ and $I_{M-N}$ have polarities opposite to each other, the summation of the output currents $I_{A-P}$ and $I_{M-N}$ in fact is a subtraction between $gm_{MAIN}$ and $gm_{AUX}$. Therefore, $gm_{LNA}$ approximates $gm_{MAIN}$ deducted by $gm_{AUX}$. FIG. 6B illustrates $gm_{AUX}$, $gm_{MAIN}$, and $gm_{LNA}$ when the LNA 300 operates in a low-gain mode. As shown in FIG. 6B, for every specified power of the inbound RF, $gm_{LNA}$ is substantially $gm_{MAIN}$ minus $gm_{AUX}$.

Figure 7:
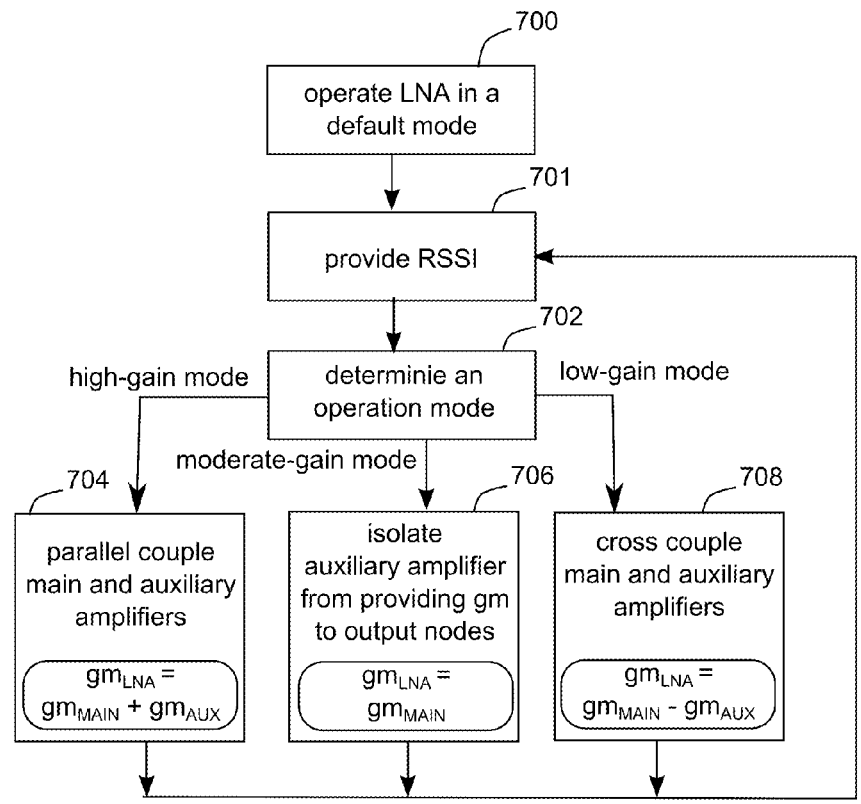
FIG. 7 shows a simplified flowchart showing an exemplary method of operating a variable-gain low noise amplifier according to an illustrative embodiment of the invention.

FIG. 7 shows a simplified flowchart showing a method of operating a variable-gain low noise amplifier according to an illustrative embodiment of the invention. Preferably, this variable-gain low noise amplifier is exemplified by the LNA 300 in FIG. 3 used in the RF receiver 200 in FIG. 2. The method begins in step 700, where the LNA 300 starts to operate in a default mode, which could be the low-gain, moderate-gain, or high-gain modes described above. Step 701 measures the signal power currently outputted by the LNA 300, and generates RSSI. Step 702 follows, checking if the current RSSI is out of a predetermined power range, defined by top and bottom power limits for instance, and determining the operation mode of the LNA 300. In the case where the current RSSI exceeds the top power limit, implying that interferers are strong, the LNA 300 is determined to operate in a relatively-lower gain mode. The LNA 300 might be switched, for example, to operate in a low-gain mode if it originally operated in a moderate-gain mode. On the contrary, if RSSI is under the low power limit, the LNA 300 is determined to operate in a relatively-higher gain mode, and the LNA 300, which operated in a moderate-gain mode for example, is switched to operate in a high-gain mode. If the current RSSI is within the predetermined power range, step 702 makes the LNA 300 stay in the current operation mode. In Steps 708, 706, and 704, the LNA 300 operates in the low-gain, moderate-gain, and high-gain modes, respectively. Step 701 follows each of steps 704, 706, and 708, forming a loop that adaptively controls the operation mode of the LNA 300, such that LNA 300 provides appropriate transconductance for the current interference environment.

Figure 8:
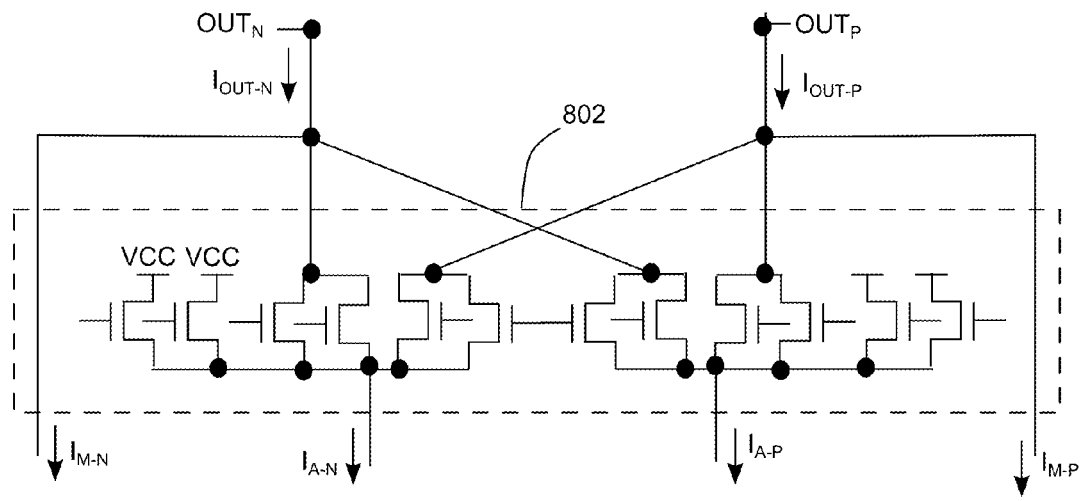
FIG. 8 shows a block diagram of an exemplary current steering module.

Even though the LNA 300 in FIG. 3 is operable in three operational modes, the invention is not limited hereto. FIG. 8 shows a block diagram of a current steering module 802, capable of replacing the current steering module 306 of FIG. 3 according to an illustrative embodiment of the invention. The current steering module 802 could operate in more than three operational modes. To operate in one slightly-higher-gain mode, for example, the transistors in current steering module 802 are controlled, such that half of $I_{A-N}$ outputted by the auxiliary amplifier 302 outputs reaches the output node $OUT_N$, the other half of $I_{A-N}$ goes to the voltage source Vcc directly, and none of $I_{A-N}$ goes to the output node $OUT_P$. As previously stated, half of $I_{A-P}$ reaches the output node $OUT_P$, and the other half goes to the voltage source Vcc directly. As a result, the transconductance of the LNA is accordingly the summation of $gm_{MAIN}$ and $0.5*gm_{AUX}$. When the LNA is determined to operate in one slightly-lower-gain mode, half of $I_{A-N}$ is directed to reach the output node $OUT_P$ through the current steering module 802, the other half of $I_{A-N}$ goes to the voltage source Vcc directly, and none of $I_{A-N}$ goes to the output node $OUT_N$. Half of $I_{A-P}$ reaches the output node $OUT_N$, and the other half goes to the voltage source Vcc directly. As a result, the transconductance of the LNA will be $gm_{MAIN}$ minus $0.5*gm_{AUX}$. Controlling a LNA according to the aforementioned method, the transconductance of the LNA can be variable, ranging from $gm_{MAIN}+gm_{AUX}$ to $gm_{MAIN}-g_{AUX}$. The teaching of the current steering modules 306 and 802 also indicates that the transconductance of a resulted LNA according to an illustrative embodiment of the invention could be a linear combination of $gm_{MAIN}$ and $gm_{AUX}$.

Please refer back to FIG. 3, the main amplifier 304 and the auxiliary amplifier 302 are preferred to be different in some aspects. In one embodiment, a bias voltage $BIAS_A$ might make the auxiliary amplifier 302 a Class A amplifier while a bias voltage $BIAS_M$ makes the main amplifier 304 a Class AB or B amplifier. In another embodiment, the main amplifier 304 is a Class A amplifier, and the auxiliary amplifier 302 a Class AB or B amplifier. The currents flowing through the active devices of main and auxiliary amplifiers (304 and 302) are preferred, but not required, to be approximately the same when the current steering module 306 is switched to a different operation mode, such that the input impedance for the inbound RF signal remains substantially unchanged. In consideration of output impedance matching, the current steering module 306 and the auxiliary amplifier 302 could use smaller devices in comparison with those used in the main amplifier 304, such that the mode change of the current steering module 306 has little or no influence to output impedance.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A variable-gain low noise amplifier, comprising:
a plurality of amplifier modules, having a plurality of input nodes capacitively coupled for receiving a RF signal, and outputting currents for output; and
a current steering module, coupled to the plurality of amplifier modules for selectively directing the currents for output according to a plurality of control signals;
wherein, a power gain of the low noise amplifier is a linear combination of power gains of the plurality of amplifier modules;
wherein, when operating in a first mode, the current steering module allows the plurality of amplifier modules to couple in parallel, such that the low noise amplifier has a transconductance proportional to a sum of transconductance of the amplifier modules;
wherein, when operating in a second mode, the current steering module allows the plurality of amplifier modules to cross couple, such that the low noise amplifier has a transconductance proportional to a subtraction of the transconductance of the amplifier modules;
wherein, when operating in a third mode, the current steering module terminates at least one of the amplifier modules such that the power gain of the low noise amplifier is independent from one of the amplifier modules.

2. The variable-gain low noise amplifier of claim 1, wherein the current steering module comprises a plurality of transistors capable of switching current paths to allow cross coupling, parallel coupling, and termination of the plurality of amplifier modules.

3. The variable-gain low noise amplifier of claim 1, wherein the plurality of amplifier modules have the same amplifier configuration and operate at different biasing conditions.

4. The variable-gain low noise amplifier of claim 1, wherein one of the amplifier modules is a Class A amplifier and another is a Class A or AB amplifier.

5. The variable-gain low noise amplifier of claim 1, wherein the amplifier modules are common-source amplifiers with a common source coupled to a ground voltage via an inductor.

6. The variable-gain low noise amplifier of claim 1, further comprising a capacitor coupled between the input nodes of the amplifier modules.

7. A low noise amplifier, comprising:
a plurality of main and auxiliary amplifier modules, having input nodes capacitively coupled for receiving a RF signal, and respectively having main and auxiliary transconductances for the inbound RF signal; and
a gain control module, coupled to receive output currents from the main and auxiliary amplifier modules;
a second controllable device that is capable of decoupling the auxiliary amplifier modules from the main amplifier modules;
wherein, the gain control module is configured in a way that when the low noise amplifier operates in a high-gain mode, the low noise amplifier has a first transconductance substantially equaled to the main transconductance plus a first portion of the auxiliary transconductance; and
when the low noise amplifier operates in a moderate-gain mode, the low noise amplifier has a second transconductance substantially equaled to the main transconductance.

8. The low noise amplifier of claim 7, wherein the gain control module is configured in a way that when the low noise amplifier operates in a low-gain mode, the low noise amplifier has a third transconductance substantially equaled to a subtraction of the main transconductance and a second portion of the auxiliary transconductance.

9. The low noise amplifier of claim 7, wherein the gain control module comprises a first controllable device that is capable of parallel coupling the main and the auxiliary amplifier modules.

10. The low noise amplifier of claim 9, wherein the gain control module further comprises a third controllable device capable of cross coupling the main and the auxiliary amplifier modules.

11. The low noise amplifier of claim 7, wherein the main and the auxiliary amplifier modules share a common inductor connected to a ground voltage.

12. The low noise amplifier of claim 7, wherein the main and auxiliary amplifier modules have a same amplifier configuration and operate at different biasing conditions.

13. A method of processing a RF signal, comprising:
providing a low noise amplifier with a plurality of main and auxiliary amplifier modules;
coupling the main and auxiliary amplifier modules in parallel when a selection indicates the low noise amplifier operating in a high-gain mode, such that the low noise amplifier has a transconductance proportional to a sum of transconductances of the amplifier modules;
cross coupling the main and auxiliary amplifier modules when the selection indicates the low noise amplifier operating in a low-gain mode, such that the low noise amplifier has a transconductance proportional to a subtraction of the transconductance of the amplifier modules;
decoupling the auxiliary amplifier modules from the main amplifier modules when the selection indicates the low noise amplifier operating in a moderate-gain mode, such that a power gain of the low noise amplifier is independent from the auxiliary amplifier modules; and
terminating the auxiliary amplifier modules.

14. The method of claim 13, further comprising:
capacitively coupling an input of the main amplifier module to an input of the auxiliary amplifier module; and
operating the main and auxiliary amplifier modules in different biasing conditions.

15. The method of claim 13, wherein the main and auxiliary amplifier modules have a same amplifier configuration.

16. The method of claim 13, further comprising: measuring the signal power currently output by the low noise amplifier; and making the selection according to the signal power.

* * * * *